(12) United States Patent
Martin et al.

(10) Patent No.: US 8,357,981 B2
(45) Date of Patent: Jan. 22, 2013

(54) TRANSDUCER DEVICES HAVING DIFFERENT FREQUENCIES BASED ON LAYER THICKNESSES AND METHOD OF FABRICATING THE SAME

(75) Inventors: David Martin, Fort Collins, CO (US); John Choy, Westminster, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 400 days.

(21) Appl. No.: 12/789,685

(22) Filed: May 28, 2010

(65) Prior Publication Data

US 2011/0291207 A1 Dec. 1, 2011

(51) Int. Cl.
*H01L 29/84* (2006.01)
*H01L 41/22* (2006.01)

(52) U.S. Cl. ........... 257/415; 257/416; 257/E29.324; 438/50; 438/53; 29/25.35

(58) Field of Classification Search .......... 438/50, 438/53; 257/E29.324, 415, 416; 29/25.35
See application file for complete search history.

(56) References Cited

U.S. PATENT DOCUMENTS

| | | | |
|---|---|---|---|
| 5,587,620 A | 12/1996 | Ruby et al. | |
| 5,736,430 A | 4/1998 | Seefeldt et al. | |
| 5,873,153 A | 2/1999 | Ruby et al. | |
| 5,894,647 A | 4/1999 | Lakin | |
| 6,307,447 B1 | 10/2001 | Barber et al. | |
| 6,320,239 B1 | 11/2001 | Eccardt et al. | |
| 6,384,697 B1 | 5/2002 | Ruby | |
| 6,414,569 B1 | 7/2002 | Nakafuku | |
| 6,507,983 B1 | 1/2003 | Ruby et al. | |
| 6,828,713 B2 | 12/2004 | Bradley et al. | |
| 7,019,604 B2 | 3/2006 | Gotoh et al. | |
| 7,128,941 B2* | 10/2006 | Lee | 427/58 |
| 7,275,292 B2 | 10/2007 | Ruby et al. | |
| 7,358,831 B2 | 4/2008 | Larson, III et al. | |
| 2003/0092203 A1* | 5/2003 | Murai | 438/3 |
| 2006/0103492 A1 | 5/2006 | Feng et al. | |
| 2007/0164631 A1 | 7/2007 | Adachi et al. | |
| 2007/0205850 A1 | 9/2007 | Jamneala et al. | |
| 2008/0048278 A1* | 2/2008 | Hishinuma et al. | 257/415 |
| 2008/0122317 A1 | 5/2008 | Fazzio et al. | |
| 2008/0122320 A1 | 5/2008 | Fazzio et al. | |
| 2008/0192963 A1 | 8/2008 | Sato | |
| 2008/0258842 A1 | 10/2008 | Ruby et al. | |
| 2008/0292888 A1 | 11/2008 | Hucker et al. | |
| 2010/0327702 A1* | 12/2010 | Martin et al. | 310/346 |
| 2011/0062535 A1* | 3/2011 | McMullen et al. | 257/419 |

OTHER PUBLICATIONS

Co-pending U.S. Appl. No. 12/495,443, filed Jun. 30, 2009.

* cited by examiner

*Primary Examiner* — Ha Tran T Nguyen
*Assistant Examiner* — Aaron Dehne

(57) ABSTRACT

A transducer array on a common substrate includes a membrane and first and second transducer devices. The membrane is formed on the common substrate, and includes a lower layer and an upper layer. The first transducer device includes a first resonator stack formed on at least the lower layer in a first portion of the membrane, the upper layer having a first thickness in the first portion of the membrane. The second transducer device includes a second resonator stack formed on at least the lower layer in a second portion of the membrane, the upper layer having a second thickness in the second portion of the membrane, where the second thickness is different from the first thickness, such that a first resonant frequency of the first transducer device is different from a second resonant frequency of the second transducer device.

8 Claims, 12 Drawing Sheets

TRANSDUCER DEVICES HAVING DIFFERENT FREQUENCIES BASED ON LAYER THICKNESSES AND METHOD OF FABRICATING THE SAME

BACKGROUND

Transducers generally convert electrical signals to mechanical signals or vibrations, and/or mechanical signals or vibrations to electrical signals. Acoustic transducers in particular convert electrical signals to acoustic signals (sound waves) in a transmit mode (e.g., a speaker application), and/or convert received acoustic waves to electrical signals in a receive mode (e.g., a microphone application). The functional relationship between the electrical and acoustic signals of an acoustic transducer depends, in part, on the transducer's operating parameters, such as natural or resonant frequency, acoustic receive sensitivity, acoustic transmit output power and the like.

Transducers, such as ultrasonic transducers, are provided in a wide variety of electronic applications, including filters. As the need to reduce the size of many components continues, the demand for reduced-size transducers continues to increase, as well. This has lead to comparatively small transducers, which may be micromachined according to various technologies, such as micro-electromechanical systems (MEMS) technology.

Various types of MEMS transducers, such as piezoelectric ultrasonic transducers (PMUTs), include a resonator stack, having a layer of piezoelectric material between two conductive plates (electrodes), formed on a thin membrane. To provide stable and predictable operation, the membrane is typically designed to have a net tensile stress. This avoids issues arising from a buckled membrane. However, the resonant frequency of a tensile membrane is very sensitive to in-plane stress. Further, the film stress typically has poor control compared to control achieved for film thickness.

SUMMARY

In a representative embodiment, a transducer array on a common substrate includes a membrane formed on the common substrate, and first and second transducers. The membrane includes a lower layer and an upper layer. The first transducer device includes a first resonator stack formed on at least the lower layer in a first portion of the membrane, the upper layer having a first thickness in the first portion of the membrane. The second transducer device includes a second resonator stack formed on at least the lower layer in a second portion of the membrane, the upper layer having a second thickness in the second portion of the membrane, the second thickness being different from the first thickness, such that a first resonant frequency of the first transducer device is different from a second resonant frequency of the second transducer device.

In another representative embodiment, a method is provided for fabricating a transducer array includes multiple transducer devices on a common substrate. The method includes forming a lower layer of a membrane on the common substrate; forming multiple resonator stacks corresponding to the transducer devices on the lower layer; forming an upper layer of the membrane on the lower layer and the multiple resonator stacks; forming a mask on the upper layer, the mask defining at least one opening configured to expose a portion of the upper layer on at least one resonator stack; changing a thickness of the exposed portion of the upper layer through the at least one mask opening to change a resonant frequency of at least one transducer device corresponding to the at least one resonator stack; and removing the mask. The changed resonant frequency is different from a resonant frequency of at least one other transducer device on the common substrate corresponding to a resonator stack covered by the mask.

In another representative embodiment, a method is provided for fabricating a transducer array including multiple transducer devices on a common substrate. The method includes forming a lower layer of a membrane on the common substrate; forming an upper layer of the membrane on the lower layer; forming multiple resonator stacks corresponding to the transducer devices on the upper layer; forming a mask on the upper layer, the mask defining at least one opening configured to expose at least one resonator stack and a corresponding portion of the upper layer; changing a thickness of the exposed portion of the upper layer through the at least one mask opening to change a resonant frequency of at least one transducer device corresponding to the at least one resonator stack; and removing the mask. The changed resonant frequency is different from a resonant frequency of at least one other transducer device on the common substrate corresponding to a resonator stack covered by the mask.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
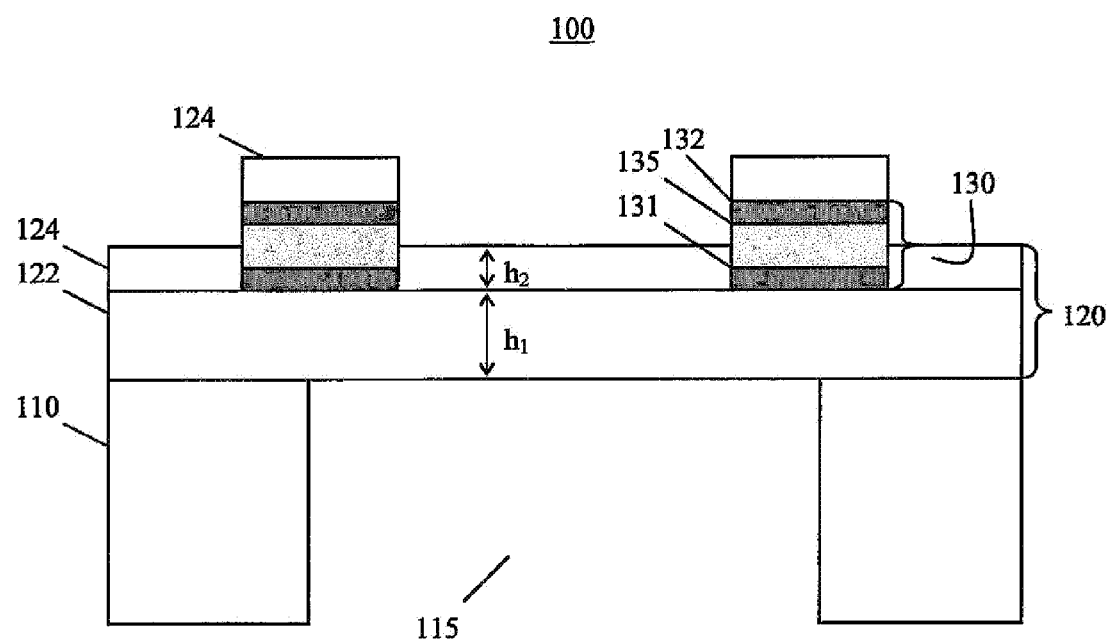
FIG. 1 is a cross-sectional diagram illustrating a transducer device, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

According to various embodiments, a transducer device, such as a MEMS acoustic transducer or a PMUT, includes an active transducer on a substrate, where the active transducer includes a resonator stack, having a layer of piezoelectric material between two conductive plates (electrodes), formed on a multiple layer membrane. The layers of the membrane have corresponding thicknesses (h) and stresses ($\sigma$), from which an average stress of the membrane may be determined.

The resonant frequency of the transducer device is a function, at least in part, of the average stress of the membrane. Therefore, the resonant frequency of the transducer device can be altered or tuned by changing the average stress of the membrane, e.g., to attain a desired or target average stress (and target resonant frequency). In various embodiments, the average stress of the membrane is changed by adjusting the thickness of at least one of the multiple layers of which the membrane is formed. For example, a top layer of the multi-layer membrane may be etched in order to decrease its thickness (e.g., increasing average stress and resonant frequency), or additional material may be applied to the top layer of the multi-layer membrane in order to increase its thickness (e.g., decreasing average stress and resonant frequency). Thus, the various embodiments leverage membrane layer thickness control to set the resonant frequency of a multi-layer membrane. Notably, the properties of the resonator stack may also affect the resonant frequency of the transducer device, although the various embodiments herein are directed to changing the average stress of the membrane.

In various embodiments, the multi-layer membrane enables setting (or tuning) the resonant frequency of one or more transducer devices during the fabrication process. For example, the thicknesses and stresses of the membrane layers may be measured during or after formation of a transducer device, and a variation in thickness of one of the membrane layers may be calculated and implemented for obtaining a target average stress corresponding to the target resonant frequency.

Also, in various embodiments, the multi-layer membrane enables formation of multiple transducer devices on a common wafer, a single die or other shared substrate (e.g., forming a transducer array), having different resonant frequencies. For example, different transducers on the common wafer may include membrane layers having different thicknesses, e.g., due to selective etching or material application processes, which result in different average stresses and corresponding resonant frequencies. The fabrication process of multiple transducer devices on a common wafer may also include the tuning process to obtain target average stresses and resonant frequencies, as generally described above.

FIG. 1 is a cross-sectional diagram illustrating a transducer device 100, according to a representative embodiment. The transducer device 100 is depicted as a singulated die, e.g., after separation from a wafer, although the transducer device 100 may be included as part of the wafer, in a packaged device and/or an array of similarly configured transducers.

Referring to FIG. 1, the transducer device 100 may be a PMUT, for example, and includes substrate 110, a multi-layer membrane 120 and resonator or resonator stack 130, where the multi-layer membrane 120 and the resonator stack 130 form an active transducer, e.g., over a cavity 115 formed in the substrate 110. In the depicted embodiment, the multi-layer membrane 120 includes lower membrane layer 122 and upper membrane layer 124, which is formed along top surfaces of the lower membrane layer 122 and the resonator stack 130. For purposes of illustration, the upper membrane layer 124 is shown in FIG. 1 as a non-conformal deposition. However, in alternative embodiments, the upper membrane layer 124 may be a conformal deposition, in which case the material of the upper membrane layer 124 would also cover the side surfaces (as well as the top surface) of the resonator stack 130, without departing from the scope of the present teachings. The resonator stack 130 includes first electrode 131 disposed over a portion of the membrane 120, piezoelectric layer 135 and second electrode 132 stacked on the first electrode 131. More particularly, in the depicted embodiment, the first electrode 131 is formed on a top surface of the lower membrane layer 122, the piezoelectric layer 135 and second electrode 132 are consecutively formed on a top surface of the first electrode 131, and the upper membrane layer 124 is formed on top surfaces of exposed portions of the lower membrane layer 122 and a top surface of the second electrode 132.

In the depicted embodiment, the resonator stack 130 is shown as an annular resonator, where the cross-section is taken across the center. For example, the annular resonator stack 130 may be substantially circular in shape, although it may be formed in different shapes, such as ovals, squares, rectangles and the like, without departing from the scope of the present teachings. Further, the resonator stack 130 need not have annular shape, but may simply be a solid resonator stack on the substrate 110.

The resonator stack 130 is substantially centered over the cavity 115, enabling mechanical movement of the membrane 120 and/or the resonator stack 130. Application of a time-dependent voltage to the resonator stack 130 causes a mechanical wave to be launched through the resonator stack 130 and the membrane 120. As the piezoelectric layer 135 of the resonator stack 130 and/or the membrane 120 oscillate in response to a mechanical perturbation (e.g., sound waves), forces generated by the perturbation induce stresses in the piezoelectric layer 135 resulting in generation of a voltage difference across the first and second electrodes 131, 132.

The substrate 110 may be formed of various types of materials compatible with semiconductor processes, such as silicon (Si), gallium arsenide (GaAs), indium phosphide (InP), or the like, which is useful for integrating connections and electronics, thus reducing size and cost. In various embodiments, the substrate 110 may include an insulating material, such as glass, sapphire, alumina or the like. The cavity 115 in the bottom surface of the substrate 110 may be substantially the same shape as the resonator stack 130, e.g., circular, although it may have any of a variety of sizes and shapes, such as oval, square, rectangular and the like, without departing from the scope of the present teachings. The cavity 115 may be obtained by back side etching the bottom surface of the substrate 110, which may include a dry etch process, such as a Bosch process, for example, although various alternative techniques may be incorporated without departing from the scope of the present teachings. Formation of the substrate 110 and the resonator stack 130 (on a membrane) is described, for example, by MARTIN et al. in U.S. patent application Ser. No. 12/495,443, which is hereby incorporated by reference.

As stated above, in an embodiment, the membrane 120 has two layers, the lower membrane layer 122 and the upper membrane layer 124, where the lower membrane layer 122 is a scaffolding layer that spans the membrane 120. For simplicity of explanation, it is assumed that the lower and upper membrane layers 122, 124 are formed of the same material, which includes various materials compatible with semiconductor processes, such as boron silicate glass (BSG), silicon dioxide ($SiO_2$), silicon nitride (SiN), polysilicon, aluminum nitride (AlN), or the like. However, the lower and upper membrane layers 122, 124 may be formed of materials different from one another and/or various different materials, without departing from the scope of the present teachings.

The lower membrane layer 122 is formed having first thickness $h_1$ and the upper membrane layer 124 is formed having second thickness $h_2$. Although the second thickness h2 is shown as being less than the first thickness $h_1$, it is understood that the first and second thicknesses $h_1$, $h_2$ may be the same or different from one another, and may vary relative to one another, depending on the desired effect of the resonant frequency of the transducer device 100, as discussed below.

In addition, the lower membrane layer 122 has first stress $\sigma_1$ and the upper membrane layer 124 has second stress $\sigma_2$. It is understood that the first and second stresses $\sigma_1$, $\sigma_2$ are different from one another, and may vary relative to one another, depending on the desired effect of the resonant frequency of the transducer device 100. More particularly, when the second stress $\sigma_2$ of the upper membrane layer 124 is less than the first stress $\sigma_1$ of the lower membrane layer 122 (e.g., the upper membrane layer 124 is compressive and the bottom membrane layer 122 is tensile), the resonant frequency may be increased by reducing the thickness of the upper membrane layer 124 and decreased by increasing the thickness of the upper membrane layer 124. In contrast, when the second stress $\sigma_2$ of the upper membrane layer 124 is greater than the first stress $\sigma_1$ of the lower membrane layer 122 (e.g., the upper membrane layer 124 is tensile and the bottom membrane layer 122 is compressive), the resonant frequency may be increased by increasing the thickness of the upper membrane layer 124 and decreased by decreasing the thickness of the upper membrane layer 124. Illustrative processes for increasing and decreasing membrane layer thicknesses are discussed below with reference to FIGS. 5A-5E, 6A-6B and 7A-7B.

According to various embodiments, the membrane 120 will behave approximately as containing a single layer membrane having a total thickness $h_1+h_2$ and a total average stress $\sigma_{avg}$, as shown in Equation (1):

$$\sigma_{avg}=(\sigma_1*h_1+\sigma_2*h_2)/(h_1+h_2). \tag{1}$$

As indicated by Equation (1), a change in the average stress $\sigma_{avg}$, and thus a change in the corresponding resonant frequency of the transducer device, can be achieved by changing only the thickness of one of the lower or upper membrane layers 122, 124. For example, assuming for purposes of explanation that the first stress $\sigma_1$ is 100 MPa, the second stress $\sigma_2$ is −100 MPa, the first thickness $h_1$ is 1.5 µm and the second thickness $h_2$ is 0.3 µm, for example, the average stress $\sigma_{avg}$ may be determined to be 67 MPa using Equation (1). If the second thickness $h_2$ were changed to 0.2 µm, for example, using an etch process, as described below with reference to FIGS. 6A-6B, the average stress $\sigma_{avg}$ would become about 76 MPa. Similarly, if the second thickness $h_2$ were changed to 0.4 µm, for example, using an application process, as described below with reference to FIGS. 7A-7B, the average stress $\sigma_{avg}$ would become about 58 MPa. These changes in average stress $\sigma_{avg}$ would produce corresponding shifts in resonant frequency of the transducer device 100. Therefore, according to various embodiments, a target average stress $\sigma_{avg}$ may be achieved by selectively decreasing and increasing the second thickness $h_2$. Of course, it is understood that the first and second thicknesses h1, h2, the first and second stresses $\sigma_2$, $\sigma_2$, and/or the target average stress $\sigma_{ave}$ may vary to provide unique benefits for any particular situation or to meet application specific design requirements of various implementations, as would be apparent to one skilled in the art. Also, in various implementations, the first thickness $h_1$ may be changed, e.g., through the cavity 115, in addition to or instead of the second thickness $h_2$.

Referring again to FIG. 1, the first and second electrodes 131, 132 may be formed of an electrically conductive material, such as molybdenum (Mo), tungsten (W), aluminum (Al), or the like. The first and second electrodes 131, 132 are electrically connected to external circuitry via contact pads (not shown), which may be formed of a conductive material, such as gold, gold-tin alloy or the like. Further, the piezoelectric layer 135 may be formed of a thin film of piezoelectric material, such as aluminum nitride (AlN), zinc oxide (ZnO), lead zirconium titanate (PZT) or other piezoelectric film compatible with semiconductor processes. The thicknesses of the first and second electrodes 131, 132 may range from about 0.05 µm to about 10 µm, and the thickness of the piezoelectric layer 135 may range from about 0.1 µm to about 10 µm, for example, although the respective thicknesses may vary to provide unique benefits for any particular situation or to meet application specific design requirements of various implementations, as would be apparent to one skilled in the art.

In various embodiments, one or more passivation layers (not shown) may be formed on top and side surfaces of the resonator stack 130 and exposed portions of the membrane 120. The passivation layer(s) may be formed of various types of materials compatible with semiconductor processes, including BSG, $SiO_2$, SiN, polysilicon, AlN, or the like, and may include multiple layers of the same or different materials. The total thickness of the passivation layer is generally sufficient to insulate the layers of the transducer device 100 from the environment, including protection from moisture, corrosives, contaminants, debris and the like, to which the transducer device 100 would otherwise be exposed. Passivation may have other design requirements to achieve desired frequency and sensitivity, as would be apparent to one of ordinary skill in the art.

Generally, in a transmit mode, an electrical input signal (e.g., excitation signal) may be input to the first and/or second electrodes 131, 132, via corresponding contact pads, and converted to a mechanical vibration (or resonance) having a frequency induced by the piezoelectric layer 135 and the membrane 120. In a receive mode, an acoustic input signal may be input to the piezoelectric layer 135 and the membrane 120, e.g., through the opening 115, and converted to a corresponding electrical output signal output by the first and/or second electrodes 131, 132, via the contact pads.

As stated above, the transducer device 100 may be an ultrasonic transducer fabricated using MEMS technology. When the transducer device 100 is a PMUT, for example, the translation is made through a piezoelectric material, e.g., by the piezoelectric layer 135. In various alternative embodiments, the transducer device 100 may be any type of micromachined transducer with a membrane having stress as a significant parameter, such as a capacitive micro-machined ultrasonic transducer (CMUT), in which case the translation is made through a capacitance variation. It is understood that other types and arrangements of membranes and/or resonators may be incorporated in the transducer device 100, without departing from the scope of the present teachings.

Figure 2:
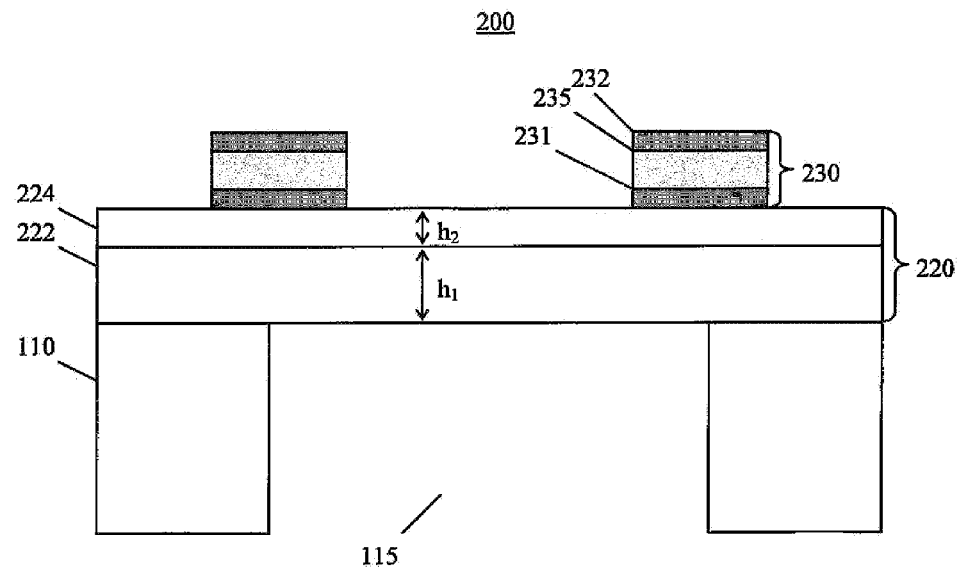
FIG. 2 is a cross-sectional diagram illustrating a transducer device, according to a representative embodiment.

The configuration of the transducer device, e.g., with respect to the multi-layer membrane may vary, without departing from the scope of the present teachings. For example, the membrane may include more than two membrane layers, or the orientation of the resonator stack with respect to the multiple membrane layers may vary. FIG. 2 is a cross-sectional diagram illustrating a transducer device 200 having one such alternative configuration, according to a representative embodiment. As discussed above, the transducer device 200 is depicted as a singulated die, e.g., after separation from a wafer, although the transducer device 200 may be included as part of the wafer, in a packaged device and/or an array of similarly configured transducers.

Referring to FIG. 2, the transducer device 200 includes substrate 110, multi-layer membrane 220 and resonator or resonator stack 230. In the depicted embodiment, the multi-layer membrane 220 includes lower membrane layer 222 and upper membrane layer 224, which is formed along a top surface of the lower membrane layer 222. The resonator stack 230 is formed entirely on a top surface of the upper membrane layer 224, as opposed to the top surface of the lower membrane layer (e.g., lower membrane layer 122 shown in FIG. 1). In particular, the resonator stack 230 includes first electrode 231 disposed on the membrane 220, and piezoelectric layer 235 and second electrode 232 are consecutively formed on the first electrode 231. In the depicted embodiment, the upper membrane layer 222 is formed before the resonator stack 230, and thus no portion of the upper membrane layer 222 is deposited on a top surface of the second electrode 232. The material and dimensions of the first and second electrodes 231, 232 and the piezoelectric layer 235 may be substantially the same as discussed above with reference to the first and second electrodes 131, 132 and the piezoelectric layer 135 of FIG. 1.

The resonator stack 230 is shown as an annular resonator, where the cross-section is taken across the center. For example, the annular resonator stack 230 may be substantially circular in shape, although it may be formed in different shapes, such as ovals, squares, rectangles and the like, without departing from the scope of the present teachings. Further, the resonator stack 230 need not have an annular shape, but may simply be a solid resonator stack on the substrate 110. The resonator stack 230 is substantially centered over the cavity 115, enabling mechanical movement of the membrane 220 and/or the resonator stack 230, as discussed above with reference to the resonator stack 130 in FIG. 1.

In the depicted embodiment, the membrane 220 has two layers, the lower membrane layer 222 and the upper membrane layer 224. For simplicity of explanation, it is assumed that the lower and upper membrane layers 222, 224 are formed of the same material, which includes various materials compatible with semiconductor processes, such as BSG, $SiO_2$, SiN, polysilicon, AlN, or the like, although the lower and upper membrane layers 222, 224 may be formed of materials different from one another and/or various different materials, without departing from the scope of the present teachings. Further, as discussed above with reference to the lower and upper membrane layers 122, 124, the lower and upper membrane layers 222, 224 are formed having first and second thicknesses $h_1$, $h_2$ and first and second stresses $\sigma_1$, $\sigma_2$, respectively. The membrane 220 will therefore behave approximately as a single layer membrane having a total thickness $h_1+h_2$ and a total average stress $\sigma_{avg}$, as indicated by Equation (1).

It is understood that variations in thickness of the upper membrane layer 224, for example, have substantially the same effect on the average stress $\sigma_{avg}$ and corresponding resonant frequency of the transducer device 200 as discussed above with respect to the transducer device 100, therefore the description of the same will not be repeated. However, it is understood that the functional relationships, e.g., among the second thickness $h_2$, the average stress $\sigma_{avg}$ and the resonant frequency, may differ somewhat due to the positioning of the resonator stack 230 with respect to the upper membrane layer 224.

Figure 3:
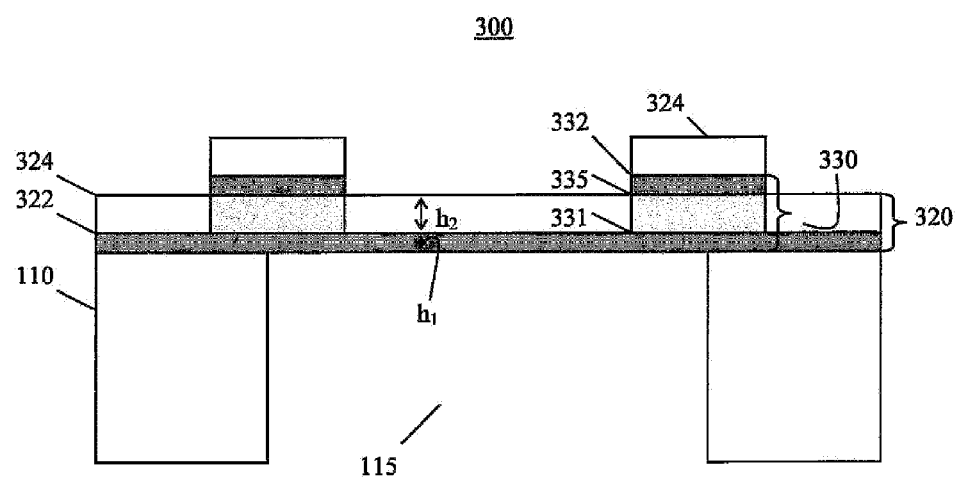
FIG. 3 is a cross-sectional diagram illustrating a transducer device, according to a representative embodiment.

FIG. 3 is a cross-sectional diagram illustrating a transducer device 300 having another alternative configuration, according to a representative embodiment. As discussed above, the transducer device 300 is depicted as a singulated die, e.g., after separation from a wafer, although the transducer device 300 may be included as part of the wafer, in a packaged device and/or an array of similarly configured transducers.

Referring to FIG. 3, the transducer device 300 includes substrate 110, multi-layer membrane 320 and resonator or resonator stack 330. Unlike the multiple layer membranes 120 and 220 discussed above, the multi-layer membrane 320 includes a conductive layer 322, used to form first electrode 331 of the resonator stack 330, as the lower or scaffolding layer. The conductive layer 322 is formed along a top surface of the substrate 110, and the remainder of the resonator stack 330 (e.g., the piezoelectric layer 335 and the second electrode 332) is formed entirely on a top surface of the conductive layer 322. In various configurations including multiple transducer devices formed in an array, for example, the conductive layer 322 may not be continuous to provide electrical isolation between first electrodes of adjacent transducer devices. In the depicted embodiment, the upper membrane layer 324 is formed along top surfaces of the conductive layer 322 and the resonator stack 330. The material and dimensions of the first and second electrodes 331, 332 and the piezoelectric layer 335 may be substantially the same as discussed above with reference to the first and second electrodes 131, 132 and the piezoelectric layer 135 of FIG. 1.

The resonator stack 330 is shown as an annular resonator, where the cross-section is taken across the center. For example, the annular resonator stack 330 may be substantially circular in shape, although it may be formed in different shapes, such as ovals, squares, rectangles and the like, without departing from the scope of the present teachings. Further, the resonator stack 330 need not have an annular shape, but may simply be a solid resonator stack on the substrate 110. The resonator stack 330 is substantially centered over the cavity 115, enabling mechanical movement of the membrane 320 and/or the resonator stack 330, as discussed above with reference to the resonator stack 130 in FIG. 1.

In various embodiments, the conductive layer 322 may be formed of an electrically conductive material, such as Mo, W, Al, or the like, while the upper membrane layer may be formed of BSG, $SiO_2$, SiN, polysilicon, AlN, or the like, for example. Further, as discussed above with reference to the lower and upper membrane layers 122, 124, the conductive layer 322 and the upper membrane layer 324 are formed having first and second thicknesses $h_1$, $h_2$ and first and second stresses $\sigma_1$, $\sigma_2$, respectively. The membrane 320 will therefore behave approximately as a single layer membrane having a total thickness $h_1+h_2$ and a total average stress $\sigma_{avg}$, as indicated by Equation (1). Of course, due to the significant differences in the materials of the conductive layer 322 and the upper membrane layer 324, Equation (1) would be modified to include weighting factors or other constants, as shown for example in Equation (2), below:

$$\sigma_{avg}=(C_1\sigma_1*h_1+C_2\sigma_2*h_2)/(h_1+h_2). \quad (2)$$

In Equation (2), constants $C_1$ and $C_2$ may be determined empirically or through simulation of the specific materials in use, for example. The constants $C_1$ and $C_2$ depend on material properties, such as density, Young's modulus and Poisson's ratio, as would be apparent to one of ordinary skill in the art.

Also, it is understood that variations in thickness of the upper membrane layer 324, for example, have substantially the same effect on the average stress $\sigma_{avg}$ and corresponding resonant frequency of the transducer device 300 as discussed above with respect to the transducer device 100, therefore the description of the same will not be repeated. However, it is understood that the functional relationships, e.g., among the second thickness $h_2$, the average stress $\sigma_{avg}$ and the resonant frequency, may differ somewhat due to the positioning of the resonator stack 330 with respect to the conductive layer 322 and the upper membrane layer 324.

As discussed above, during the course of transducer fabrication, there may be deviations in membrane stresses from the target values, which may be identified and corrected, in accordance with various embodiments. For example, FIG. 4 is a flow diagram illustrating a method of fabricating a transducer device, according to a representative embodiment.

Figure 4:
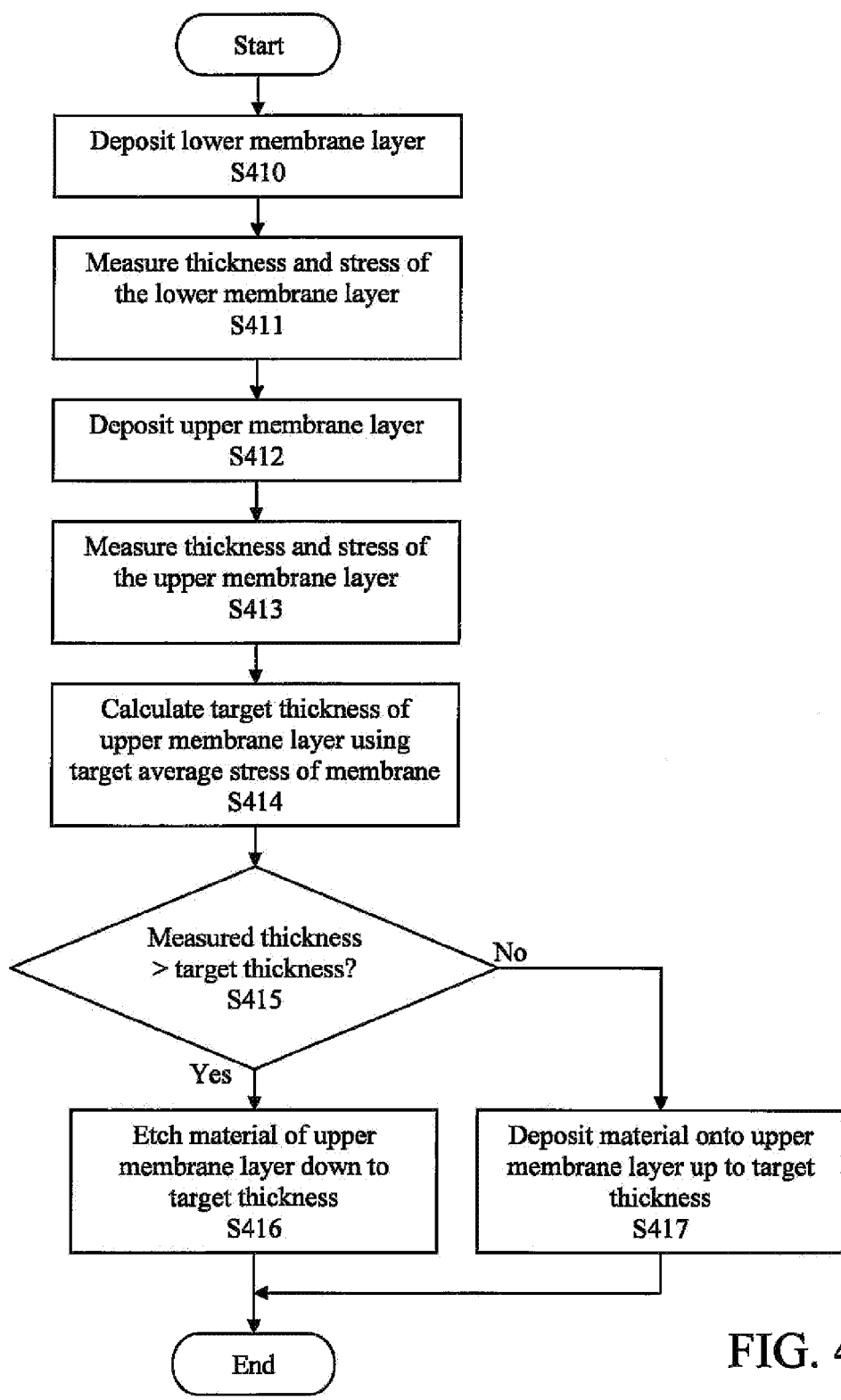
FIG. 4 is a flow diagram illustrating a method of fabricating a transducer device, according to a representative embodiment.

Referring to FIG. 4, the transducer device (e.g., transducer device 100 for purposes of discussion) is constructed using any fabrication process compatible with semiconductor processes. For example, methods, materials and structures of the transducer device may be as described by RUBY et al. in U.S. Pat. Nos. 5,587,620, 5,873,153, 6,384,697 and 7,275,292; by BRADLEY et al. in U.S. Pat. No. 6,828,713; by FAZZIO et al. in U.S. Patent Application Pub. Nos. 2008/0122320 and 2008/0122317; by JAMNEALA et al. in U.S. Patent Application Pub. No. 2007/0205850; by RUBY et al. in U.S. Patent Application Pub. No. 2008/0258842; by FENG et al. in U.S. Patent Application Pub. No. 2006/0103492; and by MARTIN et al. in U.S. patent application Ser. No. 12/495,443; all of which are hereby incorporated by reference. Notably, the teachings of these patents and patent applications are intended to be illustrative of methods, materials and structures useful to the present teachings, but in no way limiting to the present teachings.

At some point during the fabrication process, a lower membrane layer (e.g., lower membrane layer 122) is deposited on a substrate (e.g., substrate 110), as indicated in block S410 of FIG. 4. In block S411, the thickness and stress (e.g., $h_1$ and $\sigma_1$) of the lower membrane layer 122 are measured. The thickness may be measured using any of a variety of techniques, such as ellipsometry, surface profile scan, laser sonar, or the like, depending on the material, and the stress may be measured using a wafer-bow technique, for example, although any techniques for measuring thickness and stress may be incorporated without departing from the scope of the present teachings.

Subsequently during the fabrication process, an upper membrane layer (e.g., upper membrane layer 124) is deposited on the lower membrane layer 122 and/or a resonator stack (e.g., resonator stack 130), as indicated in block S412. For example, referring to FIG. 1, the upper membrane layer 124 is formed after formation of the resonator stack 130 on the lower membrane layer 122, while referring to FIG. 2, the upper membrane layer 224 is formed on the lower membrane layer 222 before formation of the resonator stack 230. In block S413, the thickness and stress (e.g., $h_2$ and $\sigma_2$) of the upper membrane layer 124 are measured, in substantially the same manner as discussed above with respect to the thickness and stress of the lower membrane layer 122.

A target thickness of the upper membrane is calculated in block S414 using the target average stress (e.g., $\sigma_{avg}$), which corresponds to the target resonant frequency. The target average stress and the target resonant frequency may be predetermined, for example, based on application specific design requirements of various implementations. The relationships between various resonant frequencies and average stresses may be retrieved from a database or determined empirically, for example. In an illustrative embodiment, the target thickness of the upper membrane is calculated using Equation (1) by solving for the second thickness $h_2$.

In block S415, it is determined whether the measured thickness of the upper membrane layer measured in block S413 is greater than the target thickness calculated in block S414. When the measured thickness of the upper membrane layer is greater than the target thickness (block S415: Yes), material is etched from the upper membrane layer to decrease the thickness down to the target thickness in block S416. When the measured thickness of the upper membrane layer is not greater than the target thickness (block S415: No), material is applied to the upper membrane layer to increase the thickness up to the target thickness in block S417. Of course, it may be determined whether the measured thickness of the upper membrane layer is less than (as opposed to greater than) the target thickness in block S415, or other comparisons may be incorporated, without departing from the scope of the present teachings.

Referring to block S416, material may be etched from the upper membrane layer using any etching technique compatible with semiconductor processes. For example, as discussed below with reference to FIGS. 5E, 6A and 6B, a mask or photoresist layer may applied to the top surface of the upper membrane layer and patterned to form a mask or photoresist pattern. In an embodiment, a shadow mask may be used, where a mask with the features defined is held in close proximity to the substrate (or wafer), for example. Exposed portions of the upper membrane layer may then be etched to the target thickness, using the mask or photoresist pattern, as would be apparent to one of ordinary skill in the art. Likewise, referring to block S417, material may be added to the upper membrane layer using any depositing technique compatible with semiconductor processes. For example, as discussed below with reference to FIGS. 5E, 7A and 7B, a mask or photoresist layer may applied to the top surface of the upper membrane layer and patterned to form a mask or photoresist pattern. Material may then be deposited on the exposed portions of the upper membrane layer, increasing the upper membrane layer to the target thickness, using the mask or photoresist pattern, as would be apparent to one of ordinary skill in the art. The mask or photoresist pattern is then removed after removing material from or adding material to the upper membrane layer.

In various embodiments, the process depicted in FIG. 4 may be applied separately to multiple transducer devices on a single wafer or other common substrate. Also, in various embodiments, all or part of the process may be repeated, if necessary, to make further adjustments to the thickness of the upper membrane layer, which effectively fine tunes the resonator frequency of the transistor device. By controlling the thickness of the upper membrane layer, the transducer device has a resonant frequency closer to the target resonant frequency than process variations would otherwise allow. It is understood that FIG. 4 depicts one representative process for measuring layer characteristics and adjusting layer thicknesses during fabrication to change (or tune) resonant frequencies, and that other processes may be incorporated without departing from the scope of the present teachings.

As stated above, multiple transducer devices having different membrane thicknesses, and thus different resonant frequencies, may be formed on a common wafer or other shared substrate, according to various embodiments. In this manner, an array of transducers having different resonant frequencies may be formed, for example.

Figure 6A:
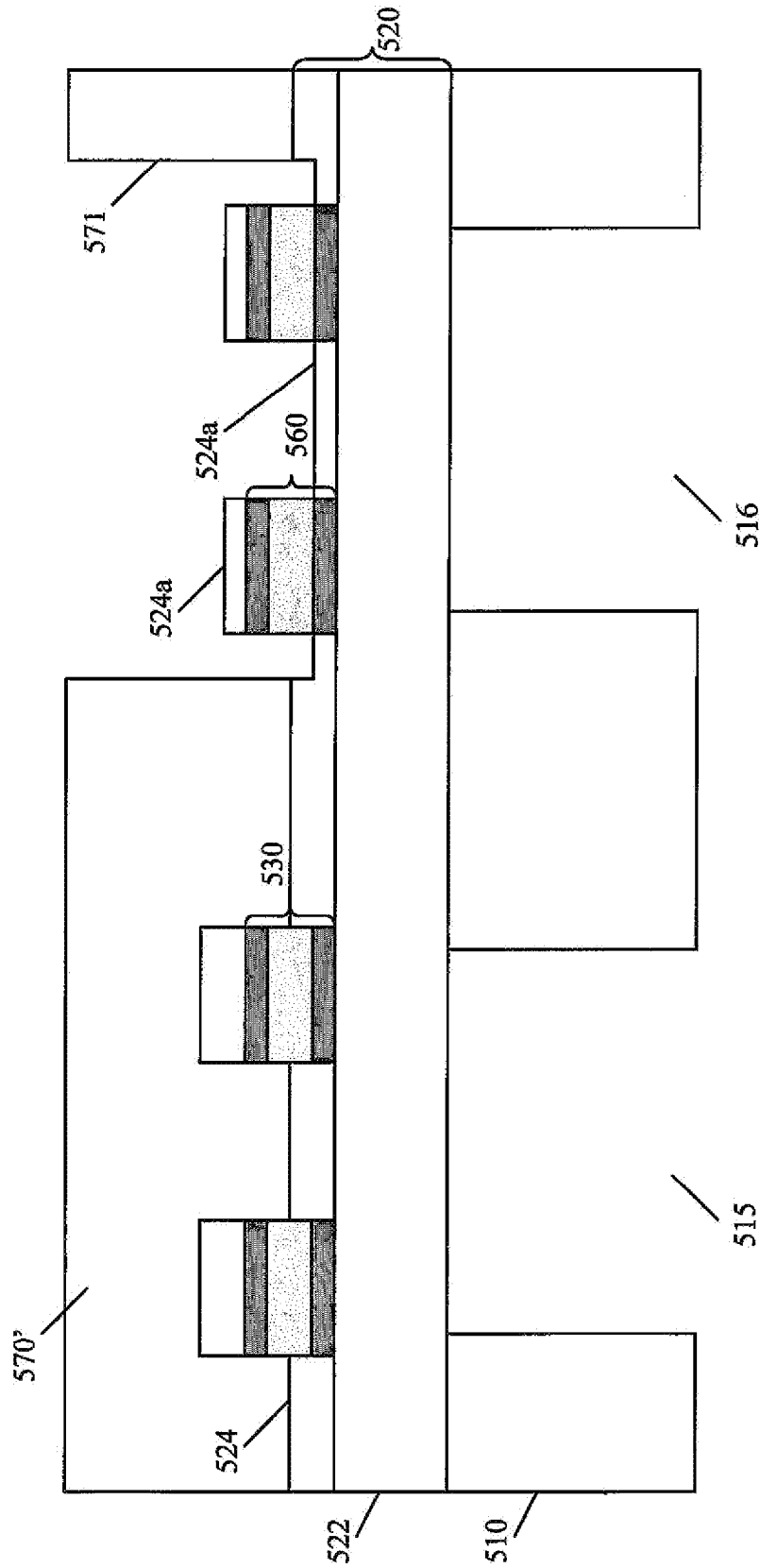
FIGS. 6A-6B are cross-sectional diagrams illustrating material etching steps in a fabrication process of transducer devices on a common wafer, according to a representative embodiment.
Figure 6B:
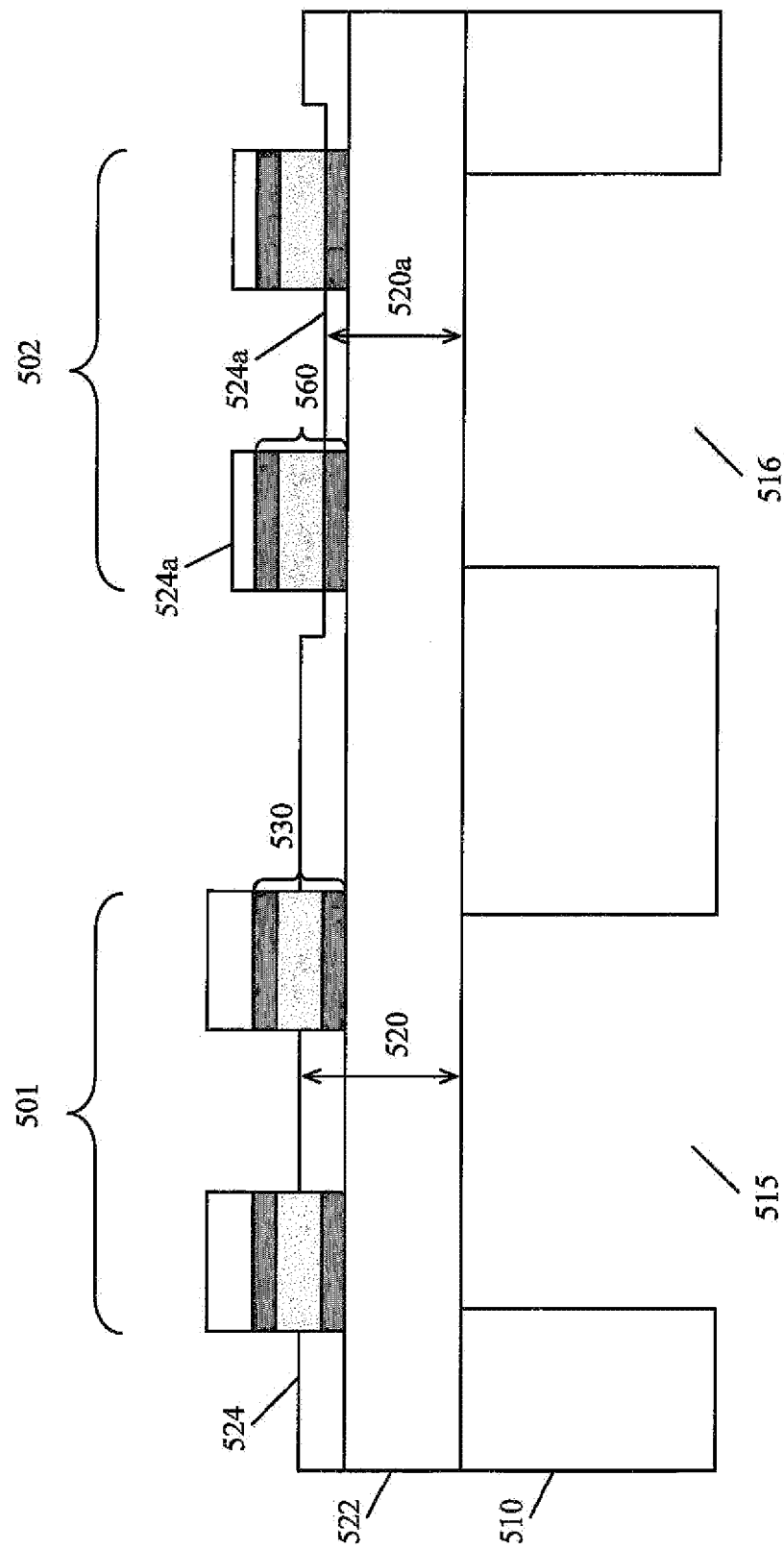
Figure 7A:
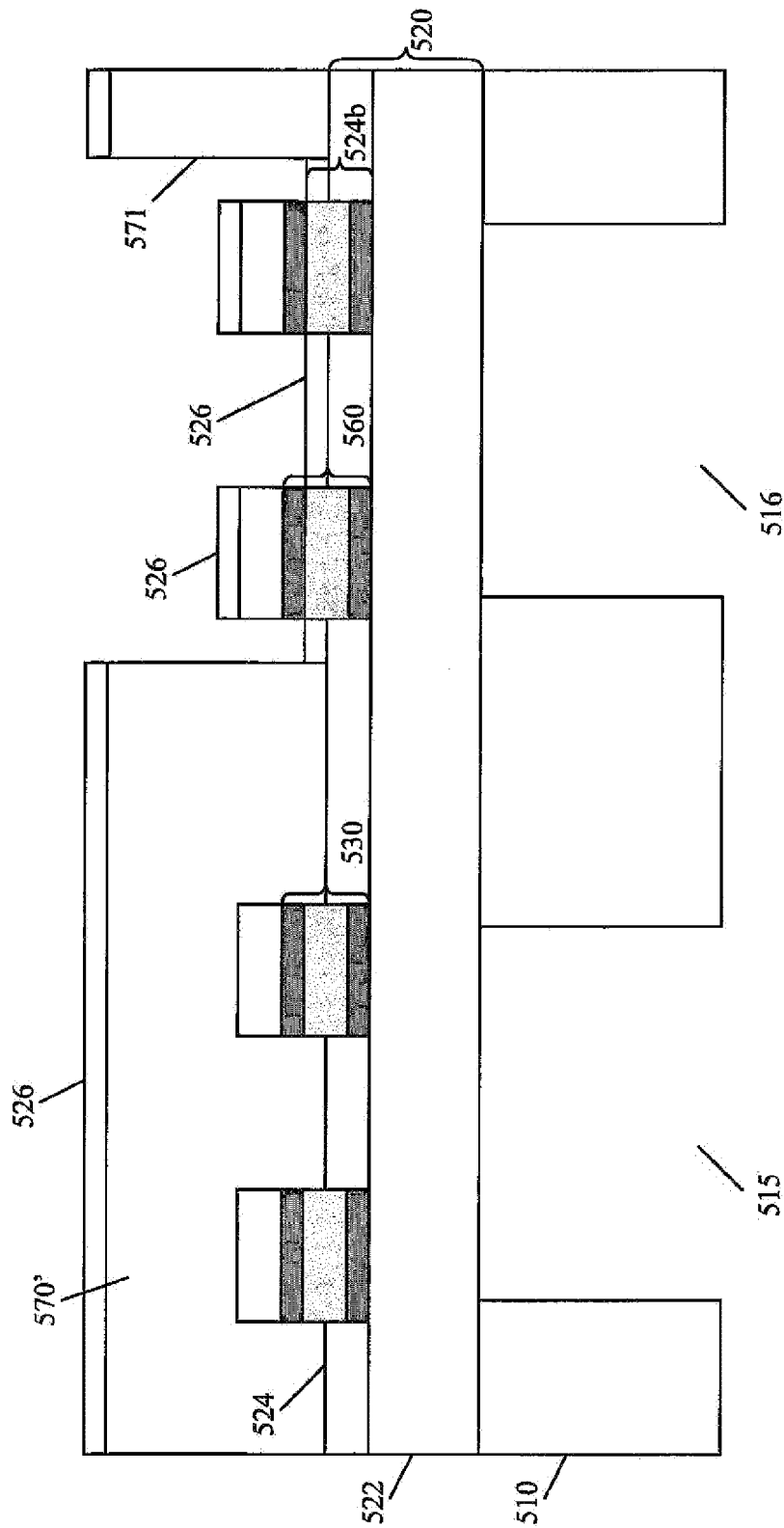
FIGS. 7A-7B are cross-sectional diagrams illustrating material disposition steps in a fabrication process of transducer devices on a common wafer, according to a representative embodiment.
Figure 7B:
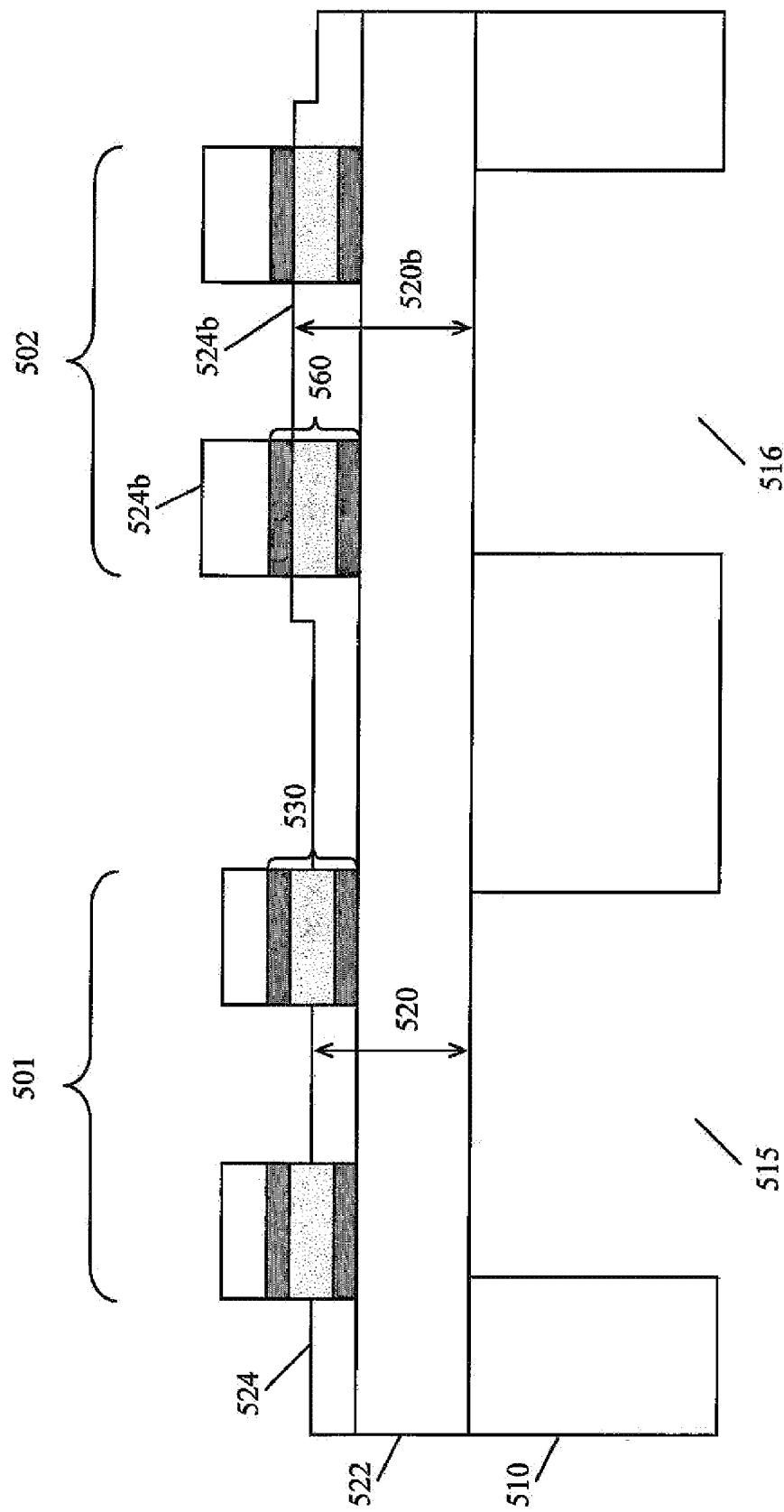

Formation of multiple transducer devices having different resonant frequencies on a common substrate, such as a wafer, is discussed below with reference to FIGS. 5A-5E, 6A-6B and 7A-7B. In particular, FIGS. 5A-5E are cross-sectional diagrams illustrating steps in a fabrication process of multiple transducer devices on a common substrate, according to a representative embodiment, up to formation of a mask. FIGS. 6A-6B are cross-sectional diagrams illustrating an etching process using the mask formed in FIGS. 5A-5E, according to a representative embodiment. FIGS. 7A-7B are cross-sectional diagrams illustrating a material disposition process using the mask formed in FIGS. 5A-5E, according to a representative embodiment. For convenience of explanation, the transducer devices formed according to the fabrication processes of FIGS. 5A-5E, 6A-6B and 7A-7B are substantially the same as the transducer device 100 shown in FIG. 1. However, the depicted fabrication processes may be varied to form other types of transducer devices (e.g., transducer devices 200 and 300 shown in FIGS. 2 and 3, respectively), as would be apparent to one of ordinary skill in the art.

Figure 5A:
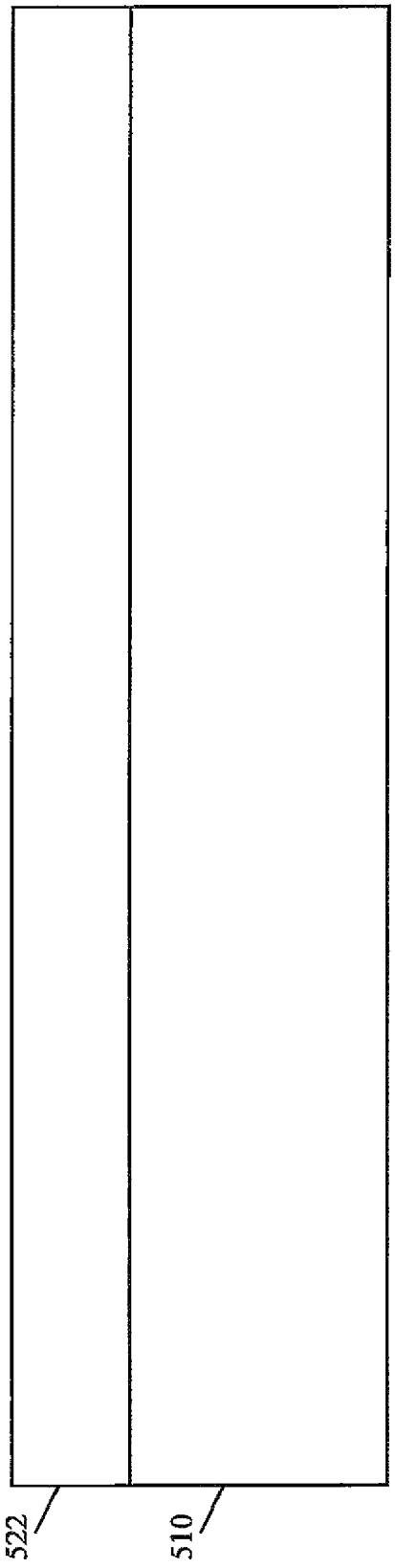
FIGS. 5A-5E are cross-sectional diagrams illustrating steps in a fabrication process of transducer devices on a common wafer, according to a representative embodiment.
Figure 5B:
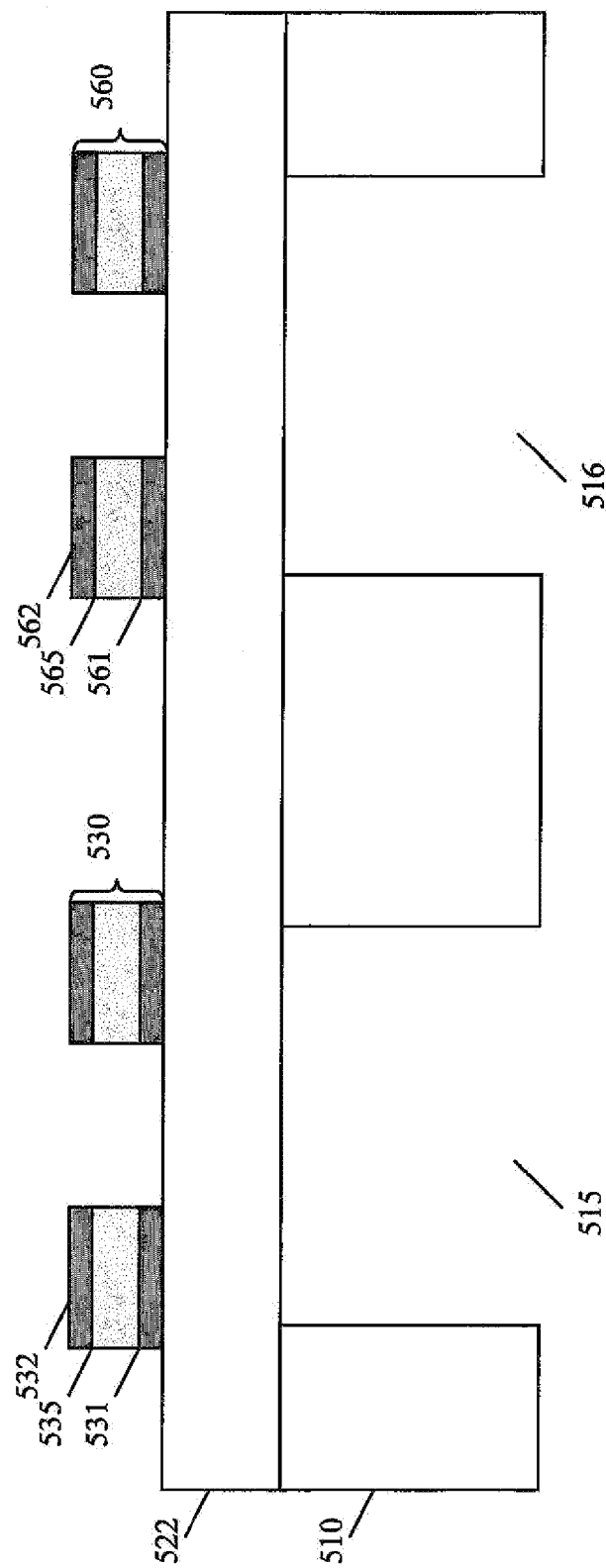

Referring to FIG. 5A, a lower membrane layer 522 is formed on the common substrate 520. As discussed above, the lower membrane layer 522 may be formed of BSG, $SiO_2$, SiN, polysilicon, or AlN, and the common substrate 520 may be formed of Si, GaAs, InP, glass, sapphire or alumina, for example, although any of a variety of materials compatible with semiconductor processes may be incorporated. Representative first and second resonators or resonator stacks 530, 560 are formed on the lower membrane layer 522, as shown in FIG. 5B. The first resonator stack 530 may be an annular resonator including piezoelectric layer 535 formed between first and second electrodes 531, 532, and the second resonator stack 560 may be an annular resonator including piezoelectric layer 565 formed between first and second electrodes 561, 562. In the depicted embodiment, the first resonator stack 530 is positioned over cavity 515 formed in the bottom surface of the common substrate 510, and the second resonator stack 560 is positioned over cavity 516 formed in the bottom surface of the common substrate 510.

The formation of the lower membrane layer 522 on the common substrate 510, and the formation of the first and second resonator stacks 530, 560 on the lower membrane layer 522, as well as the formation of the cavities 515, 516 in the common substrate 510, may be performed using any compatible fabrication processes, examples of which are described in the U.S. patents and patent applications previously incorporated by reference in the discussion of FIG. 4. In alternative embodiments, the common substrate 510 may be formed with no cavities 515, 516. For example, using solidly mounted resonator (SMR) technology, the first and second resonator stacks 530, 560 may be formed over corresponding acoustic mirrors or Bragg Reflectors (not shown), having alternating layers of high and low acoustic impedance materials, formed in the common substrate 510. An acoustic reflector may be fabricated according to various techniques, an example of which is described by LARSON, III, et al. in U.S. Pat. No. 7,358,831, which is hereby incorporated by reference. Notably, the teachings of the incorporated patents and patent applications are intended to be illustrative of methods, materials and structures useful to the present teachings, but in no way limiting to the present teachings.

Figure 5C:
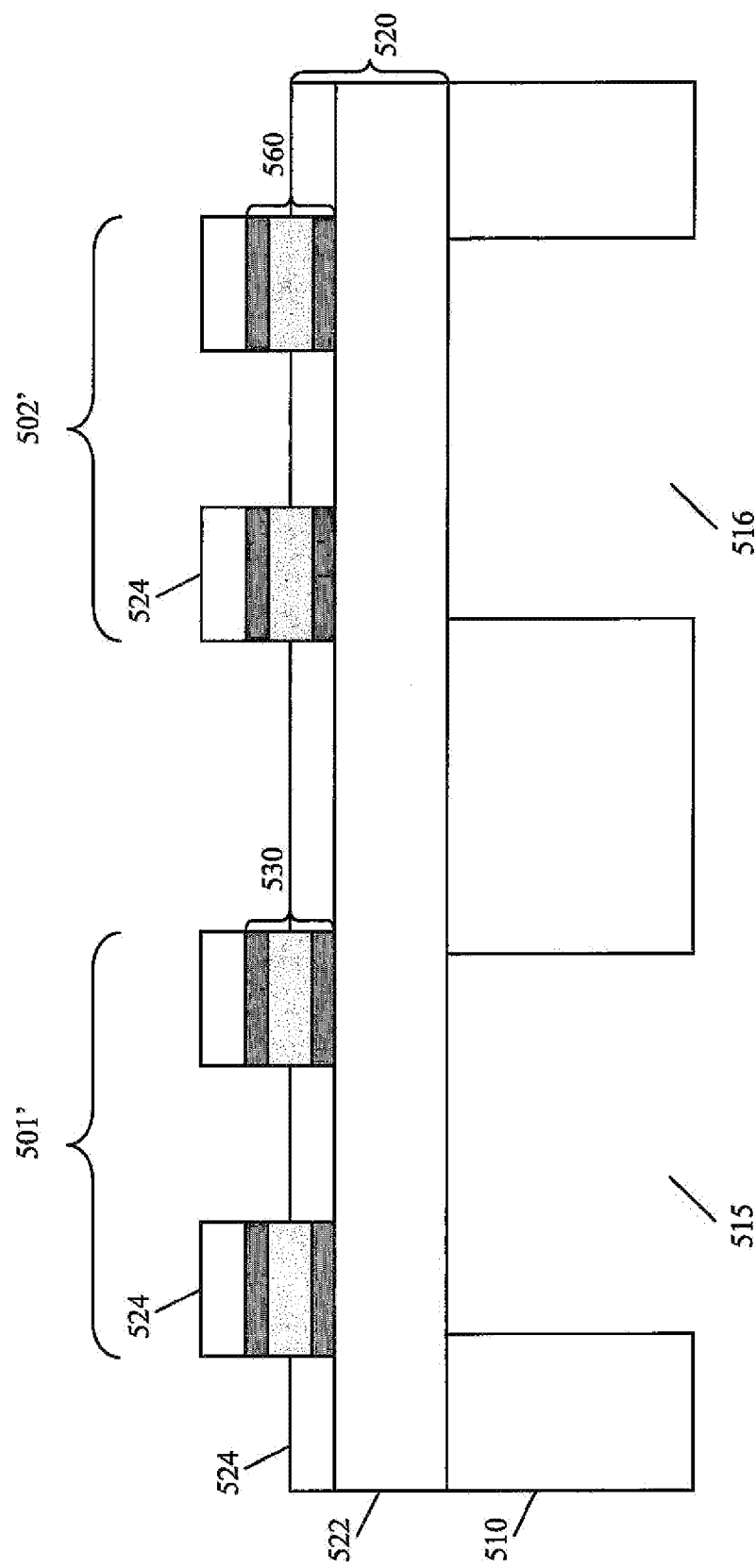

In FIG. 5C, an upper membrane layer 524 is deposited on top surfaces of the lower membrane layer 522, the first resonator stack 530 and the second resonator stack 560 to form multi-layer membrane 520. The upper membrane layer 524 may be deposited using spin-on, sputtering, evaporation or chemical vapor disposition (CVD) techniques, for example, although other application techniques may be incorporated without departing from the scope of the present teachings. As discussed above, the upper membrane layer 524 may be the same or a different material from the lower membrane layer 522. For example, the upper membrane layer 524 may be formed of BSG, $SiO_2$, SiN, polysilicon, AlN, or the like. Also as discussed above, although shown as a non-conformal deposition, it is understood that the upper membrane layer 524 may be a conformal deposition, without departing from the scope of the present teachings.

Deposition of the upper membrane layer 524 results in formation of first transducer device 501 and preliminary second transducer device 502'. At this stage of fabrication, the first transducer device 501 and the preliminary second transducer devices 502' would have about the same resonator frequencies, since the respective portions of the lower and upper membrane layers 522, 524 corresponding to the first transducer device 501 and the preliminary second transducer device 502' have substantially equal thicknesses.

Figure 5D:
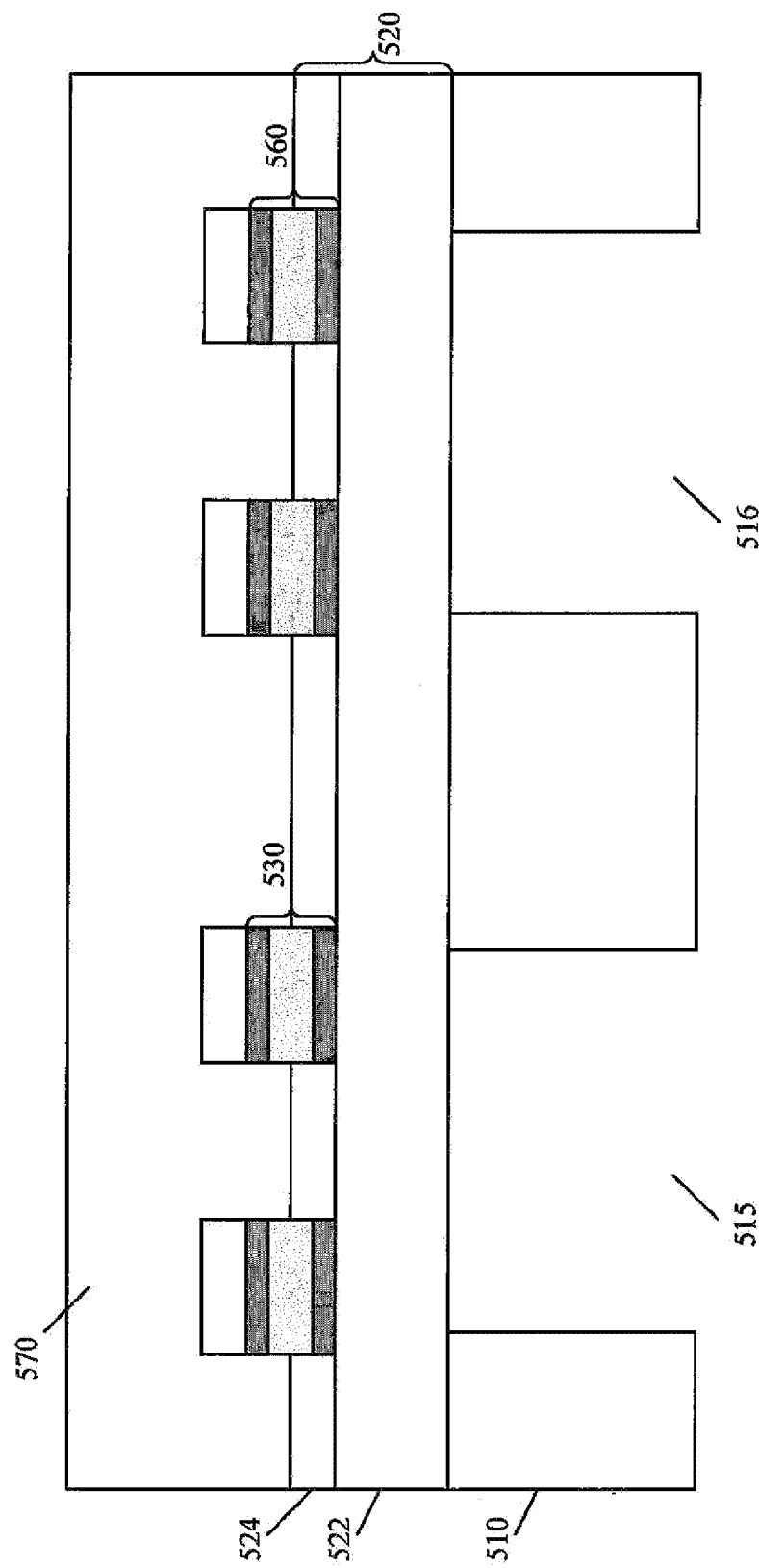
Figure 5E:
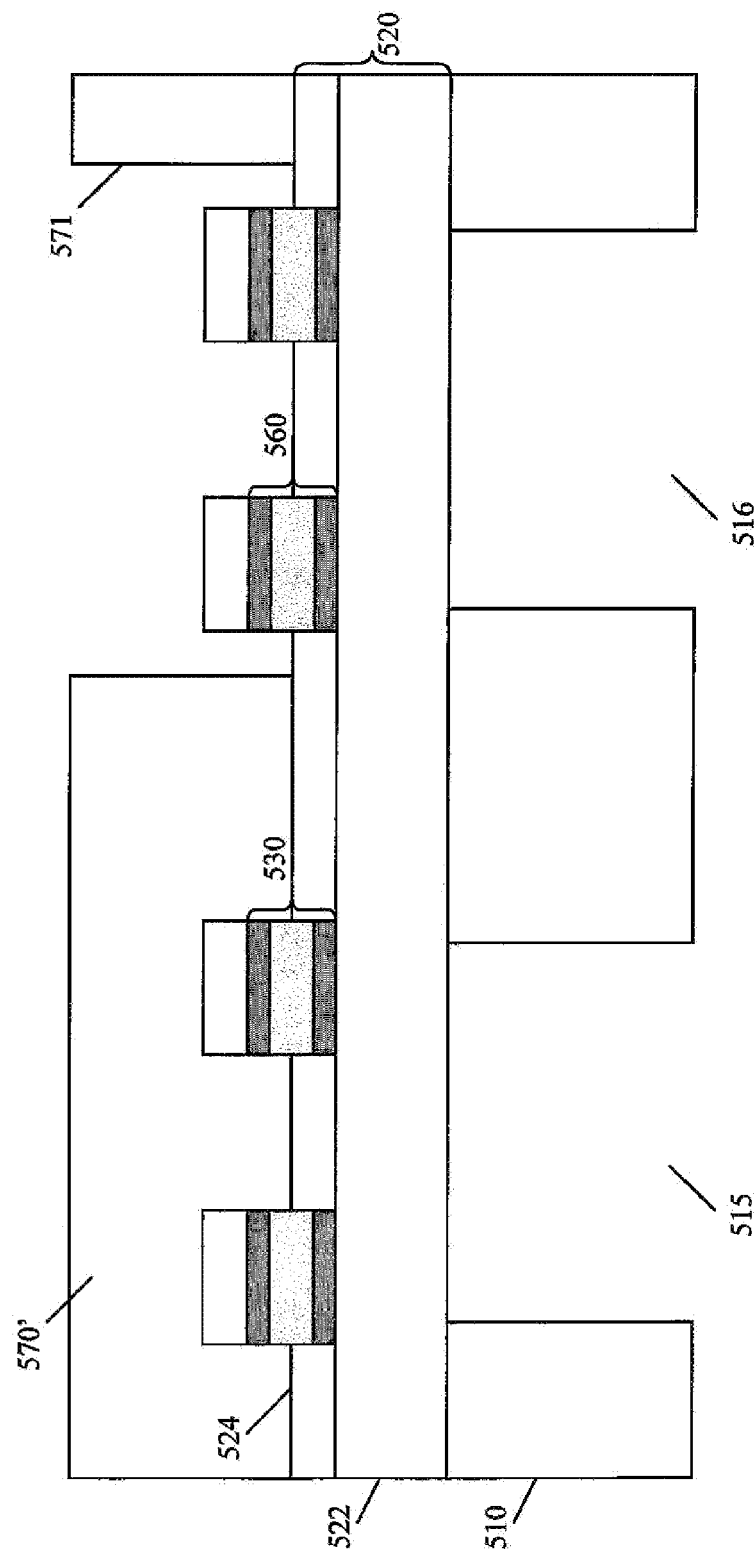

In order to alter the resonate frequency of the second transducer device 502', a photoresist or mask layer 570 is formed as shown in FIG. 5D over the upper membrane layer 524 and the first and second resonator stacks 530, 560. The mask 570 may be formed using any phostoresist or mask material compatible with semiconductor processes, as would be apparent to one of ordinary skill in the art. In FIG. 5E, the photoresist or mask layer 570 is patterned to form photoresist pattern or mask 570', which includes representative opening 571. The photoresist pattern or mask 570' may be formed by machining or by chemically etching the mask layer using photolithography, although various alternative techniques may be incorporated.

The opening 571 is formed over the resonator stack 560 of the preliminary second transducer device 502', so that material may be either etched away from the corresponding exposed portion of the upper membrane layer 524 (e.g., as shown in FIGS. 6A-6B) or added to the corresponding exposed portion of the upper membrane 524 (e.g., as shown in FIGS. 7A-7B). The opening 571 may have a number of alternative configurations, according to various embodiments. For example, the opening 571 may have any of a variety of shapes, such as such as ovals, squares, rectangles, and the like. Also, the opening 571 may be larger than the respective active area of the preliminary transducer device 502', or the opening 571 may closely surround the active area, substantially defining the same.

For purposes of discussion, it may be assumed that the upper membrane layer 524 has a lower stress than the lower membrane layer 522. In this case, when the target resonant frequency (and thus the average stress of the membrane) of the preliminary second transducer device 502' is to be higher than the resonant frequency of the first transducer device 501, then the thickness of the portion of the membrane 520 corresponding to the preliminary second transducer device 502' must be decreased by etching the portion of the upper membrane layer 524 exposed by the opening 571.

More particularly, referring to FIG. 6A, the upper membrane layer 524 is etched, using a dry etch process, such as a Bosch process, for example, although various alternative techniques may be incorporated without departing from the scope of the present teachings. As a result, a thinner upper membrane layer 524a is formed in a portion of the membrane 520 corresponding to the preliminary second transducer device 502'. The photoresist pattern or mask 570' is then removed, leaving second transducer device 502, as shown in FIG. 6B. For example, the photoresist pattern or mask 570' may be chemically released or etched, using a wet etch process including HF etch solution, although the photoresist pattern or mask 570' may be removed by various other techniques, without departing from the scope of the present teachings. As a result, the second transducer device 502 includes membrane 520a having an overall thickness that is less than that of the membrane 520 included in the first transducer device 501.

In various embodiments, the overall thickness of the membrane 520a provides the target average stress of the second transducer device 502 in order to produce the target resonant frequency, as discussed above with reference to FIG. 4. Accordingly, the first and second transducers devices 501, 502 formed on the common substrate 510 are able to have different resonant frequencies, where the resonant frequency of the second transducer device 502 is higher than the resonant frequency of the first transducer device 501.

In contrast, again assuming that the upper membrane layer 524 has a lower stress than the lower membrane layer 522, when the target resonant frequency (and thus the average stress of the membrane) of the preliminary second transducer device 502' is to be lower than the resonant frequency of the first transducer device 501, then the thickness of the portion of the membrane 520 corresponding to the preliminary second transducer device 502' must be increased by depositing additional material on the portion of the upper membrane layer 524 exposed by the opening 571.

More particularly, referring to FIG. 7A, a layer of additional membrane material 526 is deposited on the top surfaces of the photoresist pattern or mask 570' and the portion of the upper membrane layer 524 exposed by the opening 571. The deposition may include using a lift-off process or spin-on, sputtering, evaporation or CVD techniques, for example, although various alternative techniques may be incorporated without departing from the scope of the present teachings. As a result, a thicker upper membrane layer 524b is formed in a portion of the membrane 520 corresponding to the preliminary second transducer device 502'. The photoresist pattern or mask 570', as well as the portion of the additional membrane material 526 on the photoresist pattern or mask 570' is then removed, e.g., using a lift-off process, leaving second transducer device 502, as shown in FIG. 7B. For example, the photoresist pattern or mask 570' may be chemically released or etched, using a wet etch process, although the photoresist pattern or mask 570' may be removed by various other techniques, without departing from the scope of the present teachings. As a result, the second transducer device 502 includes membrane 520b having an overall thickness that is greater than that of the membrane 520 included in the first transducer device 501.

In various embodiments, the overall thickness of the membrane 520b provides the target average stress of the second transducer device 502 in order to produce the target resonant frequency, as discussed above with reference to FIG. 4. Accordingly, the first and second transducers devices 501, 502 formed on the common substrate 510 are able to have different resonant frequencies, where the resonant frequency of the second transducer device 502 is lower than the resonant frequency of the first transducer device 501.

Of course, if the upper membrane layer 524 were to have a higher stress than the lower membrane layer 522, then the etching and deposition processes would be reversed with respect to implementing desired changes to the resonant frequency (and the average stress of the membrane) of the preliminary second transducer device 502'. That is, decreasing (e.g., etching) the thickness of the portion of the membrane 520 corresponding to the preliminary second transducer device 502' would decrease resonant frequency, and increasing (e.g., depositing material) the thickness of the portion of the membrane 520 corresponding to the preliminary second transducer device 502' would increase resonant frequency.

Also, in various embodiments, all or part of the processes depicted in FIGS. 5A-5E, 6A-6B and 7A-7B may be repeated one or more times. That is, multiple masks may be used in the repeated processes, each of which opens different areas of the wafer (e.g., corresponding to different transducer devices) to allow for different amounts of material to be removed from or added to various membrane portions. Accordingly, an array having transducers with three or more different corresponding resonant frequencies may be created. In addition, measuring (thicknesses and stresses) of the membrane layers and tuning of the resonant frequencies (based on target average stresses) of the multiple transducer devices may be performed during fabrication, for example, according to the process described above with reference to FIG. 4.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A transducer array on a common substrate, the transducer array comprising:
    a membrane formed on the common substrate, the membrane comprising a lower layer and an upper layer;
    a first transducer device comprising a first resonator stack formed on at least the lower layer in a first portion of the membrane, the upper layer having a first thickness in the first portion of the membrane; and
    a second transducer device comprising a second resonator stack formed on at least the lower layer in a second portion of the membrane, the upper layer having a second thickness in the second portion of the membrane, the second thickness being different from the first thickness, such that a first resonant frequency of the first transducer device is different from a second resonant frequency of the second transducer device.

2. The transducer array of claim 1, wherein the first resonator stack is formed between the lower layer and the upper layer in the first portion of the membrane, and the second resonator stack is formed between the lower layer and the upper layer in the second portion of the membrane.

3. The transducer array of claim 1, wherein the first resonator stack is formed on both the lower layer and the upper layer in the first portion of the membrane, and the second resonator stack is formed on both the lower layer and the upper layer in the second portion of the membrane.

4. The transducer array of claim 1, wherein the lower layer and the upper layer of the membrane are formed of the same material having different stresses.

5. The transducer array of claim 4, wherein each of the lower layer and the upper layer comprises boron silicate glass (BSG).

6. The transducer array of claim 1, wherein the lower layer and the upper layer of the membrane are formed of different materials having different stresses.

7. The transducer array of claim 1, wherein the first resonator stack comprises a first piezoelectric layer formed between a first lower electrode and a first upper electrode, and the second resonator stack comprises a second piezoelectric layer formed between a second lower electrode and a second upper electrode.

8. The transducer array of claim 7, wherein the lower layer comprises at least the first lower electrode and the second lower electrode.

* * * * *